United States Patent [19]

Kordts et al.

[11] Patent Number: 4,947,033
[45] Date of Patent: Aug. 7, 1990

[54] VOLTAGE/FREQUENCY CONVERTER AND ITS USE IN AN OPTICAL WAVE GUIDE TRANSMISSION ARRANGEMENT

[75] Inventors: Jürgen Kordts, Norderstedt; Gerald K. G. Finck, Bad Schwartau, both of Fed. Rep. of Germany

[73] Assignee: U.S. Philips Corporation, New York, N.Y.

[21] Appl. No.: 286,574

[22] Filed: Dec. 16, 1988

[30] Foreign Application Priority Data

Jan. 8, 1988 [DE] Fed. Rep. of Germany ....... 3800265

[51] Int. Cl.$^5$ .............................................. H01J 40/14
[52] U.S. Cl. ............................. 250/214 R; 250/227.11
[58] Field of Search .......................... 250/214 R, 227; 307/261, 271, 350; 328/128

[56] References Cited

U.S. PATENT DOCUMENTS 3,968,447  7/1976  Baylac et al. ........................ 307/271
4,407,056  9/1977  Nakagawa ........................... 307/261

Primary Examiner—David C. Nelms
Attorney, Agent, or Firm—Robert T. Mayer

[57] ABSTRACT

The invention relates to a voltage/frequency converter which contains a first and second change-over switch (13, 20). The first change-over switch supplies in its first position a measurement voltage and in its second position a reference voltage to a first input (15) of a comparison circuit (16). The second change-over switch supplies in its first position a first signal to be integrated and in its second position a second signal to be integrated via an integrator (22, 34) to the second input of the comparison circuit. The comparison circuit generates pulses dependent on the measurement voltage and sets the two change-over switches into their first position when the voltage supplied by the integrator is equal to the reference voltage, and into their second position when the value supplied by the integrator is equal to the measurement voltage. In this arrangement, one of the signals to be integrated is derived from the measurement voltage.

6 Claims, 2 Drawing Sheets

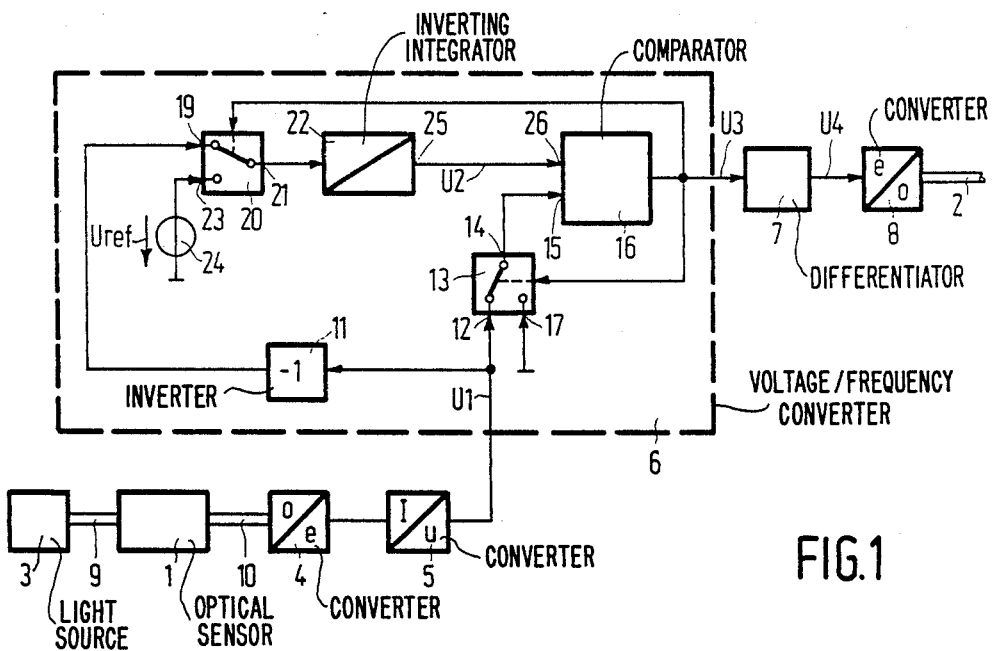
FIG.1
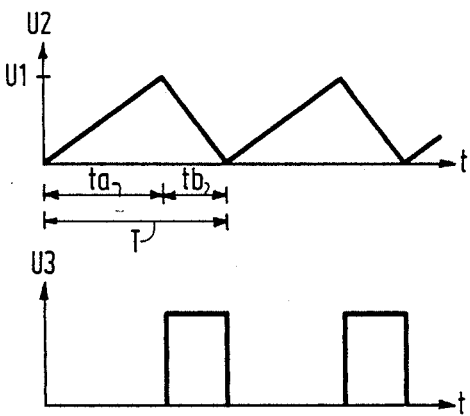
FIG.2a
FIG.2b
FIG.2c

VOLTAGE/FREQUENCY CONVERTER AND ITS USE IN AN OPTICAL WAVE GUIDE TRANSMISSION ARRANGEMENT

DESCRIPTION

BACKGROUND OF THE INVENTION

The invention relates to a voltage/frequency converter with a first change-over switch which supplies in its first position a measurement voltage and in its second position a reference voltage to a first input of a comparison circuit, and a second change-over switch which supplies in its first position a first signal to be integrated and in its second position a second signal to be integrated via an integrator to the second input of the comparison circuit which generates pulses dependent on the measurement voltage and which sets the two change-over switches into their first position when the voltage supplied by the integrator is equal to the reference voltage and into their second position when the value supplied by the integrator is equal to the measurement voltage.

Such a voltage/frequency converter converts an analog voltage into rectangular oscillations (rectangular pulses) the frequency of which is inversely proportional to the amplitude of the voltage applied. A rectangular pulse exhibiting a constant amplitude is followed by a pulse gap. The duration of the pulse and the pulse gap is defined as the duration of the period which corresponds to the reciprocal value of the frequency.

The initially mentioned voltage frequency converter is known from DE-AS No. 2,135 802. In this arrangement, a measurement voltage or a reference voltage is supplied by a firstchange-over switch to a first input of a comparison circuit. An output of an integrator is connected to the second input of the comparison circuit. The input of the integrator is supplied with a first or a second voltage to be integrated from a second change-over switch. The two voltages to be integrated exhibit an inverse polarity. In the first position of the first change-over switch, the measurement voltage is switched to the first input of the comparison circuit and in the first position of the second change-over switch the first voltage to be integrated is switched to the integrator. The comparison circuit generates a positive pulse if the integrated voltage becomes equal to the measurement voltage. This causes the two change-over switches to be switched over into their second position. In the second position of the first change-over switch, the reference voltage, which is smaller than the measurement voltage, is present at the first input of the comparison circuit and in the second position of the second change-over switch the second voltage to be integrated is present at the integrator. If the output voltage of the integrator reaches the level of the reference voltage, the pulse generated by the comparison circuit is terminated and the change-over switches are reset to their first position.

The duration of the period of the pulses generated by such a voltage/frequency converter approaches zero if the reference voltage is equal to the earth potential and the measurement voltage becomes smaller and smaller. This means that the duration of the period has a very great range of variation and there is no possibility of determining the duration of the time between two rectangular pulses if the measurement voltage is very low.

SUMMARY OF THE INVENTION

It is therefore an object of the invention to provide a voltage/frequency converter in which the duration of the time between two rectangular pulses can be determined even if the measurement voltage is very low.

In a voltage/frequency converter of the type initially mentioned, this object is achieved by the fact that one of the signals to be integrated is derived from the measurement voltage.

In the voltage/frequency converter according to the invention, the measurement voltage is supplied not only to the first change-over switch but also to the second change-over switch. One of the signals to be integrated is derived from the measurement voltage. During this process, care must be taken to ensure that the signal derived from the measurement voltage and to be integrated exhibits the opposite polarity to the other signal to be integrated. If the first signal to be integrated is negative and the second signal to be integrated is positive, the measurement voltage must always be greater than the reference voltage. If the first signal to be integrated is positive and the second signal to be integrated is negative, the measurement voltage must always be less than the reference voltage. The integrated signal derived from the measurement voltage must not become zero since the integrator then emits a constant value at the output and pulse generation is no longer possible. Due to the measure according to the invention, the duration of the period of the pulses is essentially determined by the integration constant in the case of a very low measurement voltage.

The voltage/frequency converter can also be used for forming the ratio between two measurement signals. In addition to the first change-over switch, the second change-over switch can also be supplied with another measurement signal. The frequency of the rectangular pulses then corresponds to the ratio between the measurement signals.

A first further development of the invention is characterized in that the reference voltage is equal to earth potential, the first signal to be integrated is equal to the inverted measurement voltage and the second signal to be integrated is equal to a positive reference voltage. In this further development, the shortest duration of the period between two pulses is determined by the integration constant, assuming that the measurement voltage tends towards zero. In this connection, the integrator generates an inverted integrated voltage.

Another further development of the invention is characterized in that the first signal to be integrated is equal to a negative reference current and that a voltage/current converter converts the measurement voltage into a measurement current which is equal to the second signal to be integrated. In this arrangement, the measurement voltage is converted, by means of a voltage/current converter, into a current which is supplied to the inverting integrator in the second position of the second change-over switch. In the first position of the second change-over switch, a negative, for example constant reference current is supplied to the integrator. This further development can be used for forming the ratio between two measurement currents. In this arrangement, the measurement voltage is formed from a first measurement current by means of a current/voltage converter. The other measurement current is supplied to the second change-over switch as a reference current. The reference voltage can also be equal to earth potential in this converter. When the converter is operated with a supply voltage, earth potential forms one limit of the voltage swing of the signals. Setting the reference voltage to earth potential could lead to errors. For this reason, the reference voltage is preferably derived from the measurement voltage. The voltage at the input of the first change-over switch, which is connected to its output in the second position, can therefore never become equal to earth potential.

The invention is also related to the use of a voltage/frequency converter in an arrangement for transmitting a measurement signal of an optical sensor via an optical wave guide, in which an optical measurement signal is converted in an opto-electronic converter into a current and the current is converted in a subsequent current/voltage converter into the measurement voltage, and in which the pulses supplied by the voltage/frequency converter are differentiated in a differentiating section and the differentiated pulses are converted by means of an electronic-optical converter into an optical signal which is radiated into the optical wave guide.

Optical sensors usually change the light intensity of a light transmission signal supplied to them as a function of the measurand to be registered. During the transmission of the analog optical sensor measurement signals via an optical wave guide, the optical measurement signal can be changed by the attenuation of the optical wave guide. In the above-mentioned use, the optical measurement signal supplied by a sensor is converted by means of an opto-electronic converter into an electrical measurement current and supplied to the voltage/frequency converter which generates from the measurement current electrical pulses, the frequency of which is inversely proportional to the amplitude of the analog optical measurement signal. These pulses are differentiated and radiated via an electronic/optical converter into an optical wave guide. The attenuation of the optical differentiated pulses radiated into an optical wave guide has no effect on the measurement signal since it is not the amplitude of a pulse but the duration of the period of the pulses which is dependent on the measurand.

The invention furthermore relates to the use of a voltage/frequency converter in an arrangement for transmitting two optical measurement signals of at least one optical sensor via an optical wave guide, in which a first optical measurement signal is converted in a first opto-electronic converter into a current and the current is converted in a subsequent current/voltage converter into the measurement voltage and a second optical measurement signal is converted in a second opto-electronic converter into the reference current which forms the first signal to be integrated, and in which the pulses supplied by the voltage/frequency converter are differentiated in a differentiating section and the differentiated pulses are converted by means of an electronic-optical converter into an optical signal which is radiated into the optical wave guide.

The optical measurement signal generated by an optical sensor frequently fluctuates because of the instability of the transmission light supplied to the sensor. The above use makes it possible to transmit the measurement signal independently of the instability of the transmission light. In this arrangement, the sensor signal is fed as first optical measurement signal via a first opto-electronic converter and a subsequent current/voltage converter into the voltage/frequency converter. The transmission light is converted as second optical measurement signal in a second opto-electronic converter into a reference current which is supplied to the second change-over switch. In the voltage/frequency converter, the ratio of the two measurement signals is formed as a result of which an independence from the instability of the transmission light is achieved. The signal, which corresponds to the ratio of the two measurement signals, is converted into optical pulses the duration of the period of which corresponds to the amplitude of the signal.

In the text which follows, illustrative embodiments of the invention are explained in greater detail with reference to the drawings.

BRIEF DESCRIPTION OF THE DRAWINGS

FIG. 1 shows a first block diagram of an arrangement for transmitting a measurement signal of an optical sensor via an optical wave guide with a voltage/frequency converter, FIGS. 2a, 2b and 2c show diagrammatically sketched timing related signals which occur in the arrangement according to FIG. 1.

DESCRIPTION OF THE PREFERRED EMBODIMENTS

Figure 3:
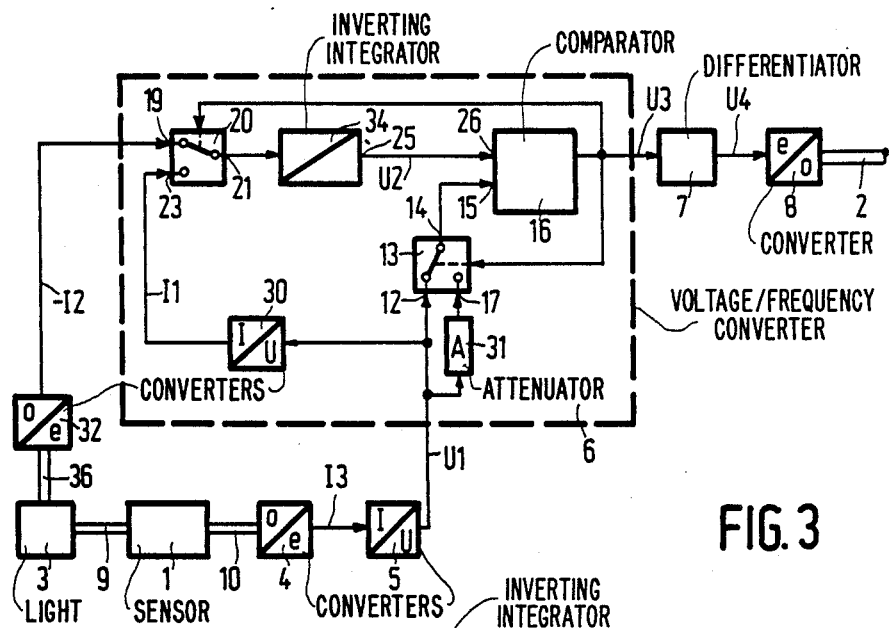
FIG. 3 shows a second block diagram of an arrangement for transmitting a measurement signal of an optical sensor via an optical wave guide with a voltage/frequency converter.

The arrangement for transmitting a measurement signal of an optical sensor 1 via an optical wave guide 2, shown in FIG. 1, contains a transmission light source 3, an opto-electronic converter 4, a current/voltage converter 5, a voltage/frequency converter 6, a differentiator 7 and an electronic-optical converter 8. The transmission light source 3 generates a transmission light which is supplied via a short optical wave guide 9 to an optical sensor 1, for example a pressure sensor. The measurand (pressure) produces a change in the intensity of the transmission light source. The transmission light influenced by the measurand is supplied as optical measurement signal via an optical wave guide 10 to the opto-electronic converter 4. The converter 4 generates an electric current which corresponds to the optical measurement signal and which is converted into an electric measurement voltage $U1$ in the current/voltage converter 5. In the subsequent voltage/frequency converter 6, a sequence of pulses, the frequency of which is inversely proportional to the analog measurement voltage $U1$, is generated from this measurement voltage.

For this purpose, the measurement voltage $U1$ is supplied to the first input 12 of a first change-over switch 13 which is a part of the voltage/frequency converter 6 and the output 14 of which is connected to the first input 15 of a comparison circuit 16. The second input 17 of the change-over switch 13 is connected to an earth potential. The measurement voltage $U1$ is also supplied via an inverter 11 to the first input 19 of a second change-over switch 20, the output 21 of which is connected to an inverting integrator 22. The second input 23 of the change-over switch 20 is connected to a reference voltage source 24. The output 25 of the integrator 22 is connected to the second input 26 of the comparison circuit 16. The two change-over switches 13 and 20 are controlled by the comparison circuit 16.

The output voltage U3 of the comparison circuit 16 or of the voltage/frequency converter 6 exhibits two voltage states. A low voltage state exists when the voltage at the first input 15 is greater than the voltage at the second input 26. If the originally lower voltage at the second input 26 of the comparison circuit 16 becomes equal to the voltage at the first input 15, the output voltage of the comparison circuit 16 is set to a higher voltage state. The higher voltage state exists when the voltage at the second input 26 is greater than the voltage at the first input 15 of the comparison circuit 16. The output voltage U3 of the comparison circuit 16, which is the control voltage for the change-over switches 13 and 20, has the effect that the switches go from the first to the second position when the output voltage of the comparison circuit 16 changes from a low to a high voltage state. The circuit switches back from the second to the first position when the output voltage of the comparison circuit 16 returns from a high voltage state to a low voltage state. The first position of the change-over switch 13 exists when its output 14 and its input 12 is connected. The output 21 is connected to its input 19 in the first position of the change-over switch 20.

When the two change-over switches 13 and 20 have returned from their second to their first positions, the integrator 20 integrates the inverted measurement voltage U1. The voltage U2 at the output 25 of the integrator is thus equal to:

$$U2 = K\, U1\, t, \quad (1)$$

where K is the integration constant of the integrator 22. If the output voltage U2 of the integrator 25 becomes equal to the voltage U1 at the first input 15 of the comparison circuit 16, the comparison circuit 16 switches the two change-over switches 13 and 20 to their second position. The time ta, at which the two change-over switches 13 and 20 are in their first positions, is given by the following equation:

$$ta = 1/K. \quad (2)$$

The output voltage U2 of the integrator 22 in the second position of the two change-over switches 13 and 20 is given by the following equation:

$$U2 = U1 - K\, Uref\, t, \quad (3)$$

where the voltage Uref is the voltage of the reference voltage source 24. The time tb begins after the switching-over from the first to the second position and ends when the voltage U2 at the second input 26 of the comparison circuit 16 has reached earth potential, that is to say is zero. The following is obtained for the time tb:

$$tb = U1/(K\, Uref). \quad (4)$$

The duration of the period T is composed of the sum of the two times ta and tb. This results in:

$$T = (1 + U1/Uref)/K. \quad (5)$$

As can be seen from equation (5), the duration of the period T approximately equals 1/K if the measurement voltage U1 becomes smaller and smaller. However, the measurement voltage U1 must never become equal to zero since a constant value then appears at the integrator output 25 and the change-over switches 13 and 20 remain in their respective positions.

The voltage/frequency converter 6 receives two voltages to be integrated, namely the inverted measurement voltage −U1 and the reference voltage Uref. As in this implementation, both voltages must exhibit inverse polarities. It is also possible to supply a negative reference voltage to the second input 23 of the change-over switch 20 and a positive measurement voltage to the first input 19 of the change-over switch 20.

In FIG. 2, the various voltages in FIG. 1 are diagrammatically sketched. The voltage U2 has a sawtooth-shaped curve. The output voltage U3 of the comparison circuit 16 has a pulse-shaped curve. The pulse occurs during the time tb and the pulse gap during the time ta. The interval between the back edges of two pulses is equal to the duration of the period and proportional to the amplitude of the measurement voltage.

The differentiating section 7 following the voltage/frequency converter 6 generates a voltage U4 which generates needle pulses from the pulses supplied by the voltage/frequency converter 6. In the electronic-optical converter 8, optical pulses are then generated from the needle pulses which are radiated into the optical wave guide 2.

The further illustrative embodiment of the arrangement for transmitting a measurement signal of the optical sensor 1 via the optical wave guide 2, shown in FIG. 3, also exhibits the transmission light source 3, the opto-electronic converter 4, the current/voltage converter 5, the voltage/frequency converter 6, the differentiating section 7 and the electronic-optical converter 8. The voltage/frequency converter 6 additionally exhibits a voltage/current converter 30 which converts the measurement voltage U1 into a measurement current I1 which is supplied to the second input 23 of the change-over switch 20. The second input 17 of the change-over switch 13 is connected to an attenuating section 31 which attenuates the measurement voltage U1 by the factor A. The first input 12 of the change-over switch 13 is supplied with the measurement voltage U1 and the output 14 of the first change-over switch 13 is connected to the first input 15 of the comparison circuit 16. The first input 19 of the change-over switch 20 is connected to a further opto-electronic converter 32. This converter 32 receives the transmission light sent out by the transmission light source 3 via an optical wave guide 36 and converts it into an electric current −I2. The two currents I1 and −I2 are alternately integrated in an inverting integrator 34, the output voltage U2 of which is supplied to the second input 26 of the comparison circuit 16. The output voltage U3 of the comparison circuit 16 is supplied as control voltage to the two change-over switches 13 and 20 and to the differentiating section 7 which supplies the differentiated voltage U4 to the electronic optical converter 8.

The voltage/frequency converter 6 of FIGS. 3 and 1 operates in an identical manner. In the first position of the two change-over switches 13 and 20, the following output voltage U2 of the integrator 34 is obtained:

$$U2 = A\, U1 + I2\, K1\, t, \quad (6)$$

where A is the attenuation constant of the attenuating section 31 and K1 is the integration constant of the integrator 34. The measurement voltage U1 is generated from the measurement current I3 generated by the opto-electronic converter 4 by means of the current/voltage converter 5, which is proportional to the light intensity of the optical measurement signal. The following is obtained for the time ta in which the two change-over switches 13 and 20 are in their first position:

$$ta = (I3/I2)\, S1\, (1-A)/K1, \quad (7)$$

where U1=S1 I3 and S1 is the conversion constant of the current/voltage converter 5.

The output voltage U2 of the integrator 34 in the second position of the two change-over switches 13 and 20 is given by the following equation:

$$U2 = U1 - I1\, K1\, t. \quad (8)$$

For the time tb in which the two change-over switches 13 and 20 are in their second position, the following holds true:

$$tb = S2\, (1-A)/K1, \quad (9)$$

where I1=U1/S2 and S2 is the conversion constant of the voltage/current converter 30. Summing the two times ta and tb results in the duration of the period T. The following is obtained after summing the two equations (7) and (9):

$$T = (1-A)\, (S2 + S1\, I3/I2)/K1. \quad (10)$$

Equation 10 shows that the duration of the period T for a low measurement current I3 is dependent on the attenuation constant A, the conversion constant S2 and the integration constant K1. In this illustrative embodiment, too, the measurement current I3 must never become equal to zero.

Figure 4:
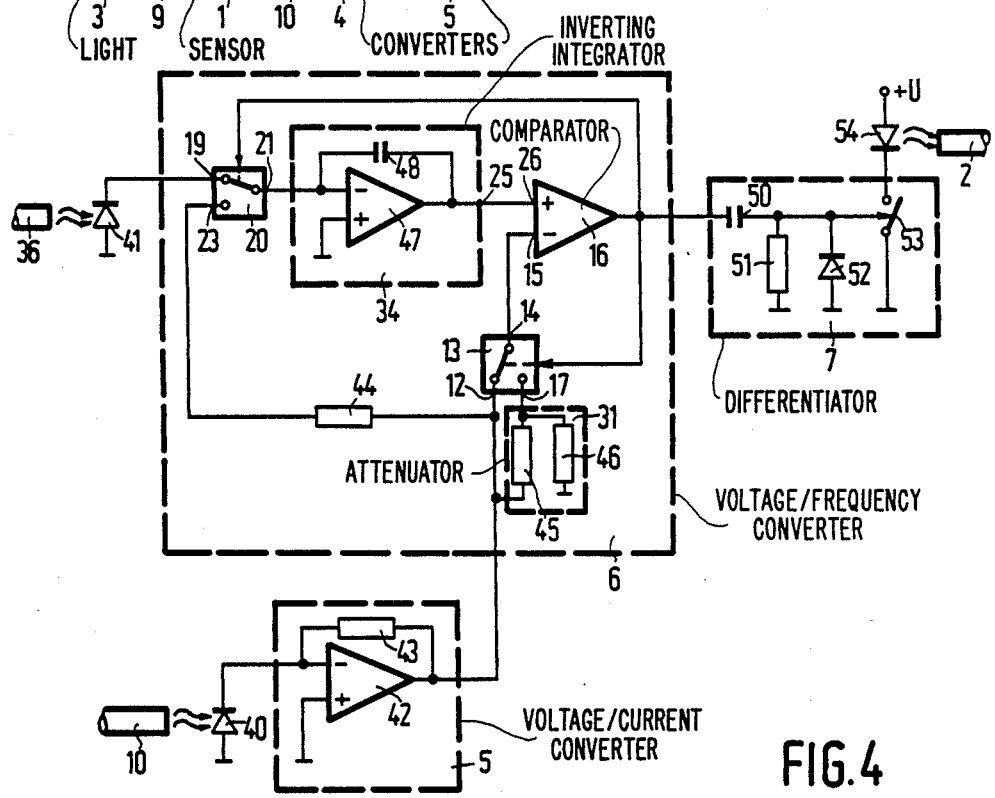
FIG. 4 shows a slightly more detailed illustrative embodiment of the arrangement according to FIG. 3.

A slightly more detailed illustrative embodiment of FIG. 3 is shown in FIG. 4. The opto-electronic converters 4 and 32 are in each case implemented by means of photodiodes 40 and 41. The photodiodes 40 and 41 in each case convert the optical signals transported by optical wave guides 10 and 36 into an electrical current.

The anode of photodiode 40 is connected to earth whilst the cathode is connected to the inverting input of an amplifier 42 the non-inverting input of which is connected to earth potential. The output of the amplifier 42 is coupled back to its inverting input by means of a resistor 43. The amplifier 42 and the resistor 43 form the current/voltage converter 5.

The measurement voltage U1 supplied by the amplifier 42 is supplied via a resistor 44 to the second input 23 of the second change-over switch 20, to the first input 12 of the first change-over switch 13 and via a resistor 45 to the second input 17 of the first change-over switch 13. Resistor 44 is the voltage/current converter 30. Resistor 45 is a component of the attenuation section 31 which also contains a resistor 46 connected to earth potential. The common connection of the resistors 45 and 46 is connected to the second input 17 of the first change-over switch 13. When the arrangement shown in FIG. 4 is operated with a supply voltage, earth potential forms one limit of the voltage swing of the signals. Setting the reference voltage to earth potential at the second input 17 of the change-over switch 13 could lead to errors. This is why operation at the limit of the voltage swing is prevented by means of the attenuation section 31.

Output 14 of the first change-over switch 13 is connected to the inverting input 15 of an amplifier constructed as comparison circuit 16. The non-inverting input 26 is connected to output 25 of the inverting integrator 34. The integrator 34 contains an amplifier 47 the non-inverting input of which is connected to earth potential and the inverting input of which is connected to its output via a capacitor 48. The change-over switch 20 supplies the signal present at its inputs 19 or 23 to the inverting input of the amplifier 47. The input 19 of the change-over switch 20 is connected to the cathode of photodiode 41 the anode of which is connected to earth potential.

The output of the amplifier 16 is connected to the differentiating section 7 which supplies the output signal U3 via a capacitor 50 to a parallel circuit of a resistor 51 connected to earth potential and a diode 52. The anode of the diode 52 is also connected to earth potential. The common connection of the capacitor 50, the resistor 51 and the diode 52 is connected to a control input of a switch 53. If a differentiated pulse is present, the switch 53 is closed. The switch 53 is connected, on the one hand, to earth potential and, on the other hand, to the cathode of a light-emitting diode 54 the anode of which is connected to a supply voltage +U. The diode 54 representing the electronic-optical converter 8 radiates an optical signal into the optical wave guide 2.

What is claimed is:

1. Voltage/frequency converter with a first change-over switch (13) which supplies in its first position a measurement voltage and in its second position a reference voltage to a first input (15) of a comparison circuit (16), and with a second change-over switch (20) which supplies in its first position a first signal to be integrated and in its second position a second signal to be integrated via an integrator (22, 34) to the second input (26) of the comparison circuit which generates pulses dependent on the measurement voltage and which sets the two change-over switches into their first position when the voltage supplied by the integrator is equal to the reference voltage, and into their second position when the value supplied by the integrator is equal to the measurement voltage, characterized in that one of the signals to be integrated is derived from the measurement voltage.

2. Voltage/frequency converter according to claim 1, characterized in that the reference voltage is equal to earth potential, the first signal to be integrated is equal to the inverted measurement voltage and the second signal to be integrated is equal to a positive reference voltage.

3. Voltage/frequency converter according to claim 1, characterized in that the first signal to be integrated is equal to a negative reference current and that a voltage/current converter (30, 44) converts the measurement voltage into a measurement current which is equal to the second signal to be integrated.

4. Voltage/frequency converter according to claim 3, characterized in that the reference voltage is also derived from the measurement voltage.

5. Use of a voltage/frequency converter according to one of the preceding claims in an arrangement for transmitting a measurement signal of an optical sensor (1) via an optical wave guide (2), in which an optical measurement signal is converted in an opto-electronic converter (4) into a current and the current is converted in a subsequent current/voltage converter (5) into the measurement voltage, and in which the pulses supplied by the voltage/frequency converter (6) are differentiated in a differentiating section (7) and the differentiated pulses are converted by means of an electronic-optical converter (8) into an optical signal which is radiated into the optical wave guide (FIG. 1).

6. Use of a voltage/frequency converter according to claim 3 or 4 in an arrangement for transmitting two optical measurement signals of at least one optical sensor (1) via an optical wave guide (2), in which a first optical measurement signal is converted into a current in a first opto-electronic converter (4) and the current is converted in a subsequent current/voltage converter (5) into the measurement voltage and a second optical measurement signal is converted in a second opto-electronic converter (32) into the reference current which forms the first signal to be integrated, and in which the pulses supplied by the voltage/frequency converter (6) are differentiated in a differentiating section (7) and the differentiated pulses are converted by means of an electronic-optical converter (8) into an optical signal which is radiated into the optical wave guide (FIGS. 3, 4).

* * * * *